(12) United States Patent
Buehler et al.

(10) Patent No.: US 8,010,925 B2
(45) Date of Patent: Aug. 30, 2011

(54) METHOD AND SYSTEM FOR PLACEMENT OF ELECTRIC CIRCUIT COMPONENTS IN INTEGRATED CIRCUIT DESIGN

(75) Inventors: Markus Buehler, Weil im Schoenbuch (DE); Juergen Koehl, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 12/121,397

(22) Filed: May 15, 2008

(65) Prior Publication Data

US 2008/0301612 A1    Dec. 4, 2008

(30) Foreign Application Priority Data

Jun. 1, 2007  (EP) .................................. 07109419

(51) Int. Cl.
*G06F 17/50*  (2006.01)
(52) U.S. Cl. .................... 716/119; 716/122; 716/126
(58) Field of Classification Search ............. 716/10, 716/12, 13, 14, 119, 122, 126
See application file for complete search history.

(56) References Cited

U.S. PATENT DOCUMENTS

| 6,068,662 | A  | * | 5/2000 | Scepanovic et al. | ............ 716/2 |
| 6,904,584 | B2 |   | 6/2005 | Brenner et al. | |
| 2001/0010090 | A1 | * | 7/2001 | Boyle et al. | ............ 716/2 |
| 2003/0217338 | A1 | * | 11/2003 | Holmes et al. | ............ 716/2 |

* cited by examiner

*Primary Examiner* — Thuan Do
*Assistant Examiner* — Magid Y Dimyan
(74) *Attorney, Agent, or Firm* — John E. Campbell; Lynn L. Augspurger (57) ABSTRACT

The invention relates to a method and a system for placing electric circuits in integrated circuit chip design. Specifically, the invention encompasses performing a global placement step placing the cells into bins on the chip, as well as a detailed placement process which arranges the cells in the bins to obtain a legal arrangement while generating simply connected free space for routing channels.

11 Claims, 5 Drawing Sheets

Fig. 7

METHOD AND SYSTEM FOR PLACEMENT OF ELECTRIC CIRCUIT COMPONENTS IN INTEGRATED CIRCUIT DESIGN

FIELD OF THE INVENTION

The invention relates to a method and a system for placing electric circuits on a chip. Specifically, the invention provides a method and a system for placing electric circuits onto a chip in such a way that the available routing space is maximized.

BACKGROUND OF THE INVENTION

In the manufacture of microelectronics, circuits and other logic must be placed on chips under certain wirability and timing constraints. Specifically, the electric circuits must be placed in such a way that the wiring interconnects between the cells are within the wiring constraints of the chip. Moreover, the wiring interconnects between the cells cannot be placed arbitrarily close to each other. Rather, a certain wiring pitch must be observed. Placement of cells on a chip is especially problematic when the wiring requirements between the electric circuits approach the wiring availability. In these situations, the resulting wiring congestion can cause "hot spots" on the chip which make the design unwirable. Therefore, it is necessary to optimize the placement of cells on the chip so that the available wiring space matches the routing requirements.

Attempts have been made to provide improved circuit placement. In general, such attempts begin by positioning cells (typically including circuits, transistors and other elements) on a chip while minimizing the sum of the squared net length. Subsequently, the chip is then divided/partitioned into a first placement level having four bins or quadrants. The cells are then arranged in the four bins. Next, each of the four bins are partitioned into a second placement level having four sub-bins, and the cells for each bin are arranged in the corresponding sub-bins. The process can then be repeated for subsequent placement levels until a minimum bin size is reached. Although this allows the cells to be physically positioned on the chip, it does not guarantee a wirable chip placement. To provide a wirable chip placement, a user must subsequently either manually identify the positioned logic nodes that cause wiring congestion and reduce the circuit density accordingly, or reduce the overall chip density by increasing the chip size. In the case of the former, several time-consuming iterations are required. In the case of the latter, increasing the chip size will lead to a substantial increase in cost.

The U.S. Pat. No. 6,904,584 B2 discloses a method and a system for placing cells based on an estimated wiring congestion. In congested areas the placement density is reduced, thus reducing the original congestion problem. The output of this placement is an assignment of cells to placement bins. In a final detailed placement step cells are legally placed inside the designated placement bins. Since cells are usually blocked on the first wiring layer M1 by a major portion of their area, this results in a highly fragmented routing space on the first wiring layer which can hardly be used by a routing tool. Due to the high number of first wiring layer shapes and since the first wiring layer cannot be used for significant routing anyway, many modern routers use the first wiring layer M1 strictly for pin access to considerably improve the router's runtime behavior. In typical standard cells of a 90 nm design, the placement densities are between 60 to 70%. Hence, a significant amount of routing space is given up. But even if the router would use the first wiring layer routing resources, the fragmented nature of the placement only allows very short segments that do not improve wireability. Additional vias are needed to wire down into the empty first wiring layer area and back again.

In view of the foregoing, there is a need for a method and a system for placing logic nodes on a chip in such a way as to improve wiring and make better use of the routing resources of the first wiring layer M1.

SUMMARY OF THE INVENTION

It is an object of the invention to provide a method and a design tool where the chip placement can be improved and wiring layer resources can be enhanced.

These objects are achieved by the features of the independent claims. The other claims and the specification disclose advantageous embodiments of the invention.

According to a first aspect of the invention, a method for placing electric circuits on a chip is provided which includes a detailed placement step which arranges the cells in such a way that additional simply connected free space is generated. This connected free space can used for routing, thus enhancing the routing resources. The method comprises the steps of (1) performing a global placement step in the course of which the chip area is partitioned into bins and the each electric circuit is assigned to exactly one of these bins, (2) performing a global wiring of the chip based on the bin structure and calculating the horizontal and vertical wiring congestion for each bin, and (3) performing detailed placement step—based on the previously calculated horizontal and vertical congestion information—in which the cells are arranged in such a way that a simply connected free space for routing is generated. This method allows the global placement step to meet various objectives (e.g. minimizing the critical net delay, avoiding wiring overload while optimizing packing density of circuits on the chip, etc.), without giving any consideration to the distribution of free space between the cells within the bin; this may leave the free space highly fragmented. The subsequent detailed placement step mends this fragmentation by clustering the cells within the bin, thus creating larger connected areas of free space which can be used for routing.

According to a second aspect of the invention, a system for placing electric circuits on a chip is provided. The system comprises (1) a partition system for partitioning a chip into a placement level of bins, (2) a positioning system for positioning cells comprising said circuits into the bins and (3) a placement system for placing the cells in the bins. The placement system comprises a global placement system a global placement system for placing the cells in the bins as well as a detailed placement system for legally arranging the cells in the bins such as to accumulate free space for routing.

Advantageously the invention allows accumulating fragmented free space between the cells into larger free sections, which constitute additional available space for the placement of wires. In the case of congestion driven placement, the fragmentation free space is caused by a synthetic increase ("blow-up") of cell size which is performed in order to reduce cell density within certain overloaded bins. The difference in area between the "blown-up" and the "real" (physical) cells corresponds to small, scattered patches of free space between the cells which can be transformed into useful routing space using the present invention. For application specific integrated circuits (ASICs), typical placement densities amount to 60%-70% of the chip area. Using the present invention, the remaining voids between the cells can, at least partly, be accumulated into coherent free space which can be used for circuitry, namely for long interconnect.

BRIEF DESCRIPTION OF THE DRAWINGS

The present invention together with the above-mentioned and other objects and advantages may best be understood from the following detailed description of the embodiments, but not restricted to the embodiments, in conjunction with the accompanying drawings which show.

The drawings are merely schematic representations, not intended to portray specific parameters of the invention. Moreover, the drawings are intended to depict only typical embodiments of the invention and therefore should not be considered as limiting the scope of the invention. In the drawings, like elements are referred to with equal reference numerals.

DETAILED DESCRIPTION OF THE INVENTION

Generally, the present invention provides a method for placing cells comprising electric circuits, transistors, etc. on a chip in such a way that free space between the electric circuits is accumulated into coherent sections which can be used for interconnections.

In the following, the present invention will be described in detail applied to congestion driven placement. According to this embodiment of the invention, the cells are placed on a chip in such a way as to avoid congestion while enhancing the space available for routing.

Figure 1:
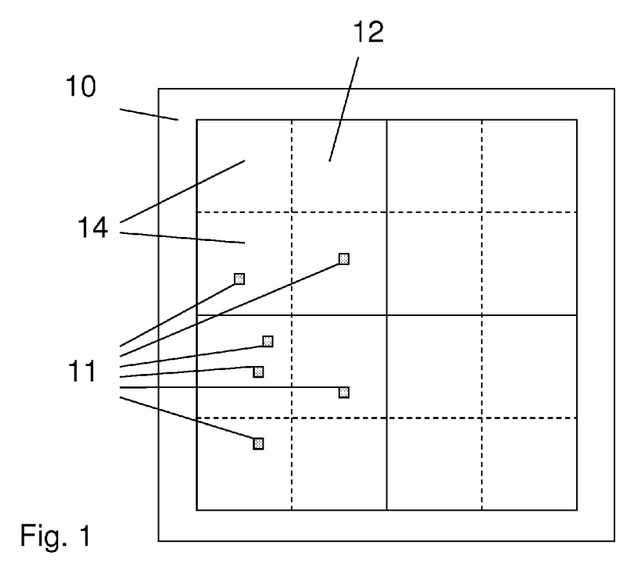
FIG. 1 a chip having cells comprising electric circuits positioned in 4×4 bins corresponding to a second placement level of the chip area.

FIG. 1 shows a schematic view of an ASIC chip 10 containing a multitude of cells 11 of which only a tiny fraction is shown in FIG. 1. The process of positioning and arranging the cells on the chip starts out from a netlist which comprises a description of the cells 11 and their connections. A system partitioning step divides a large system into blocks, and a floorplanning step arranges the blocks of the netlist on the chip.

In a subsequent global placement step, the cells are exactly positioned on the chip. The objective of the global placement step consists in distributing the cells 11 on the chip 10 in such a way as to guarantee that routing of all cells 11 can be completed while fulfilling other criteria such as minimizing the critical net delays and making the chip 10 as dense as possible. During placement, the chip is successively partitioned into placement levels of bins, with each subsequent placement level increasing the number of bins. Methods to attain this successive partitioning of the chip area include quadrisection and bisection. In each placement level, the cells are distributed within the bins of this placement level according to certain criteria, e.g. in such a way as to minimize interconnect length while avoiding overcrowding of the bins. FIG. 1 shows a second placement level in which the cell area has been divided into sixteen bins 14 of equal size.

Once the cells 11 have been positioned within the bins 14, possibly with overlaps or at illegal locations, a global routing step, based on a routing graph of the design, roughly designates the areas in which detailed routing will later place the interconnections. Thus, global routing reduces the search area for detailed routing. Typically, an input for the global router is a floorplan that includes the locations of all the fixed and flexible blocks, the placement information of the flexible blocks and the locations of all the cells. The goal of global routing is to provide complete instructions to the detailed router on where to route every net. This should be done with minimizing the total interconnect length, by maximizing the probability that the detailed router can complete the routing and by minimizing the critical path delay.

In order to carry out global routing, the netlist is mapped onto a routing graph in such a way that the cells are mapped into nodes and the nets connecting the cells are mapped into wires connecting the nodes. Moreover, the chip area is being partitioned into rectangles called tiles which, generally, are chosen to have the same size but can also differ in size. Being rectangular, each tile has four edges. Each of these edges is associated with a capacity which describes the maximum number of wires allowed to cross this edge. The task of the global router consists in distributing the wires over the tiles in such a way as to minimize overall net length while avoiding an overcrowding of the tile edges. As a result of global routing, each net is associated with a set of tiles forming a search space in which the detailed router will place the physical interconnections.

In traditional chip design, the placement step and the global routing step were carried out sequentially. The placement step, comprising a positioning and arranging of the cells, was accomplished via quadratic optimization, min-cut or other known procedures. Such arrangements of cells on the chip, however, failed to address wireability concerns and often resulted in a chip having regions in which the demand for wiring interconnects between cells exceeded the wiring availability, resulting in so-called "hot spots". To alleviate the problem of wiring demand exceeding availability, congestion driven placement procedure are used which achieve congestion avoidance by incorporating global routing steps into the global placement process. An example of a method of placing cells on a chip based on an estimated wiring congestion is described in U.S. Pat. No. 6,904,584 B2.

When carrying out a congestion driven placement process which is a combination of global placement and global routing steps, it is advantageous to choose the tiles used in global routing to coincide in size and shape with the bins used in placement. This facilitates a synchronization of global placement and global routing steps. The chip 10 is partitioned into a hierarchy of placement levels of bins, with each subsequent placement level increasing the quantity of bins. For example, each subsequent placements level partitions each bin of the previous placement level into four sub-bins. FIG. 1 depicts a second placement level in which each of the 2×2 bins 12 of the first placement level (the edges of which are indicated by solid lines) has itself been partitioned into 2×2 bins 14 (the edges of which are indicated by dotted lines). The chip 10 can be further partitioned for up to approximately twelve placement levels.

In a first placement step, the chip 10 is partitioned into the first placement level of four (2×2) bins 14 into which the cells 11 are arranged (e.g. based on quadratic optimization or min-cut). Then, each of the four bins 12 is further partitioned into a second placement level to yield a placement grid of sixteen (4×4) bins 14 into which the cells 11 are rearranged (e.g. based on quadratic optimization or min-cut). Subsequently, a global routing step is carried out on the bin structure of this first placement level. The resulting cell distribution is analyzed to detect bins with wiring overload and "hot spots", e.g. using the method described in U.S. Pat. No. 6,904,584 B2. Once these overloaded bins are identified, steps are taken to reduce the overload. Specifically, cells 11 will be relocated from overloaded bins to adjacent bins in such a way as to meet wiring constraints. This is accomplished by synthetically adjusting the size of the cells according to the overload of the corresponding bin. Thus, cells in overloaded bins will be increased in size (blown up) by a predetermined percentage. This increase in size, although synthetic and not actual, causes fewer cells to fit within the overloaded bins. In order to avoid overlaps of the synthetically blown-up cells, a detailed placement step is carried out during which particular cells are relocated to other (non-overloaded) bins of chip 10, thus yielding a legal arrangement of cells.

Once the cells 11 have been placed for a given placement level, the chip 10 is partitioned into the subsequent placement level, and the steps are repeated up to the highest placement level. In a final detailed placement step, the cells will be legally placed inside the designated placement bins. Since the assignment and distribution of the cells in the bins is generated using congestion driven placement, bins with a high demand of global wiring will have a reduced placement density while bins with a lower global wiring will have a higher placement density. Since logic nodes in congested areas are synthetically increased in size, during the global placement procedure a larger amount of space is reserved for these logic nodes than is actually physically needed.

Figure 2:
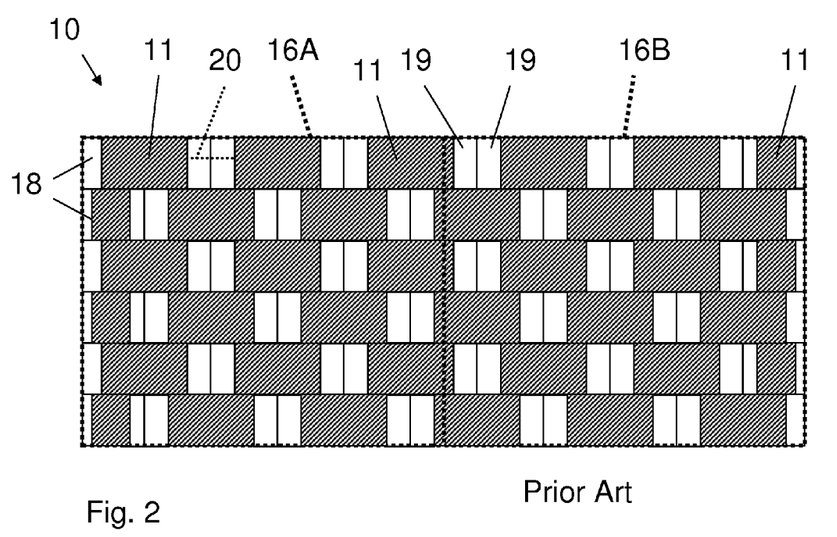
FIG. 2 a distribution of cells in two adjacent bins, as generated by congestion driven global placement and consecutive local placement (state of the art)

A typical outcome of such a congestion driven placement process, encompassing a congestion driven global placement process followed by a detailed placement step, looks like the cell arrangement of FIG. 2 which shows a detailed view of two adjacent bins 16A and 16B of the highest placement level. In particular, FIG. 2 shows the M1 wiring level of a chip 10 of a 90 nm design. The bin structure of the given placement level is indicated by fat dotted lines. In the example of FIG. 2, bins 16A, 16B have a size of six circuit rows 18 in height and about the same width; generally, the bins typically have a height and width of 4-10 circuit rows 18. Individual cells 11 are arranged along the circuit rows 18 such that wiring constraints are satisfied. The real (physical) area of each cell 11 is indicated by a hatched rectangle. However, due to the synthetic size increase of the cells resulting from congestion driven placement described above, each cell 11 blocks an additional free space 19 which corresponds to the blow-up which the cell 11 underwent during congestion driven placement. Thus, the total area blocked by a cell 1 typically exceeds the real (physical) area of the cell 11 by 20-40%; the blow-up areas 19 blocked due to size increase are indicated in FIG. 2 by blank rectangles. As can be seen from FIG. 2, this results in a fragmented occupancy of the cell area, leaving significant fraction of the M1 wiring level unusable and thus wasted. Even though in theory the blank areas 18 in the M1 wiring level could be used for routing, in practice the fragmented nature of the placement only allows very short segments of interconnect in the M1 wiring level, as indicated by an exemplary segment of interconnect 20 in FIG. 2. Even though the free spaces 19 could in theory be used for interconnect, additional vias are needed to wire down into the empty areas 19 of the M1 wiring level and back again whenever interconnects between non-neighboring cells are to be made. This impedes wireability.

Figure 3:
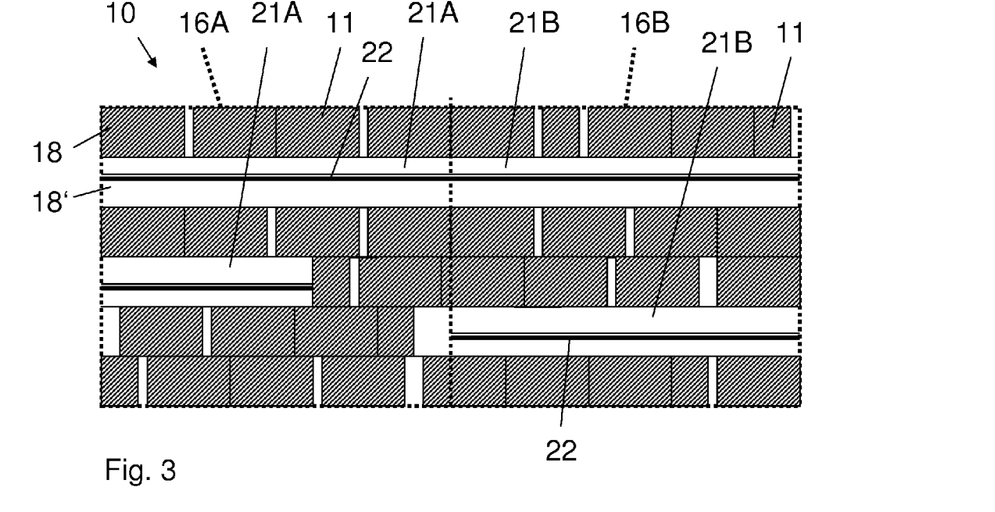
FIG. 3 a distribution of the cells of FIG. 2, as generated by congestion driven global placement and consecutive local placement in an area of horizontal congestion.

According to the present invention, the final detailed placement step is performed in such a way that the small individual free spaces 19 between the cells 11 are lumped and a larger, simply connected space 21A, 21B is generated. Thus, the invention leads to a reclaiming of the free spaces 19, since the cells 11 in the bins 16A, 16B are distributed such that the small free spaces 19 are accumulated into larger areas and made available for routing. FIG. 3 shows the outcome of such a detailed placement step for the region of the chip 10 shown in FIG. 2: After performing a final detailed placement step according to the invention, the cells 11 in the bins 16A, 16B are arranged in such a way that free space is accumulated in selected cell rows 18, leaving one cell row 18' completely free of cells 11. Thus, simply connected areas 21A, 21B of free space aligned in specific cell rows 18 are generated which can be used for long sections of interconnect 22, allowing a horizontal power bus to be placed in the M1 wiring level. In the example of FIG. 2, cells in adjacent bins 16A, 16B are lumped in such a way that along cell row 18', the free space 20A of bin 16A is aligned with the free space 20B of bin 16B, thus forming a horizontal routing channel spanning several bins 16A, 16B. Note that the number of cells 11 in FIGS. 2 and 3 are the same; the cells 11 are just arranged differently within the bins 16A, 16B.

In chip designs of 90 nm technology, the internal M1 power bus is oriented in the horizontal; thus, for 90 nm technology, detailed placement is advantageously performed the way shown in FIG. 3, lumping the free space in specific rows 18'—preferably spanning many adjacent bins—which then can be used for routing channels for long interconnect.

Figure 4:
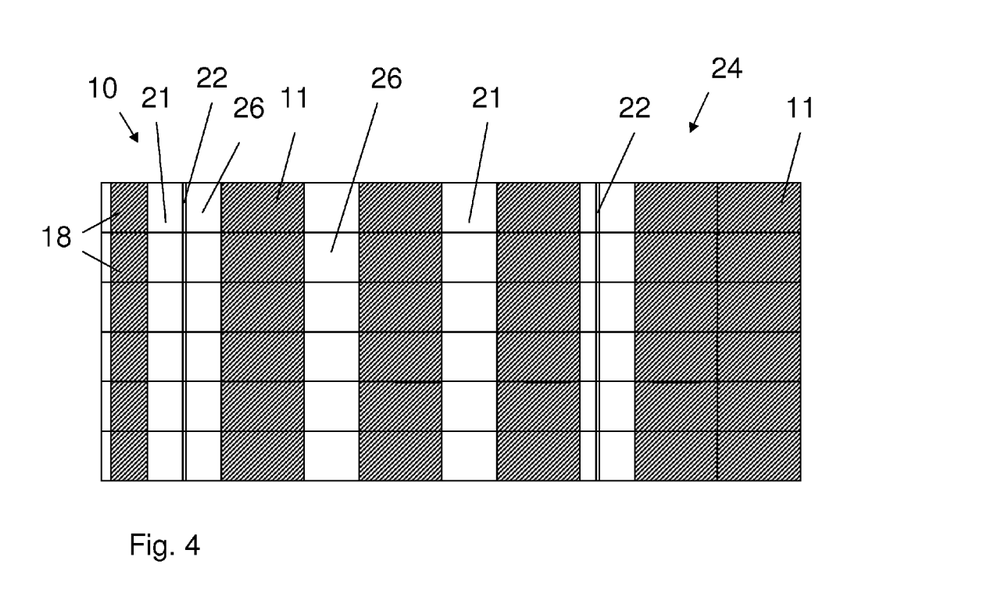
FIG. 4 a distribution of the cells of FIG. 2, as generated by congestion driven global placement and consecutive local placement in an area of vertical congestion.

In chip designs of technologies below 65 nm it is necessary to move the internal horizontal M1 power bus to the M2 wiring level because of electromigration issues. Thus, the M1 wiring level has no preferred routing direction, and the free areas can be accumulated to create either vertical or horizontal routing channel, e.g. based on the local congestion in the area under consideration. The congestion information is derived from the global routing step. An example of an outcome of a detailed placement step according to the invention as applied to chip design for a technology below 65 nm is illustrated in FIG. 4 which shows a region 24 of the chip 10 with vertical congestion; here, the detailed placement is carried out in such a way as to lump free space 21 in the vertical direction, thus creating several vertical routing channels 26 of different width which can be used for placing long sections of vertical interconnect 22 in the M1 wiring level. In regions of the chip where horizontal congestion is prevalent, detailed placement is carried out in such a way as to create free space oriented in horizontal direction for horizontal routing channels such as the ones shown in FIG. 3. The structure of vertically and horizontally oriented free space corresponding to vertical and horizontal routing channels may vary across the area of the chip 10 according to the congestion condition of the area under consideration, so that the chip 10 may contain some regions with vertical routing channels and others with horizontal routing channels.

Figure 5:
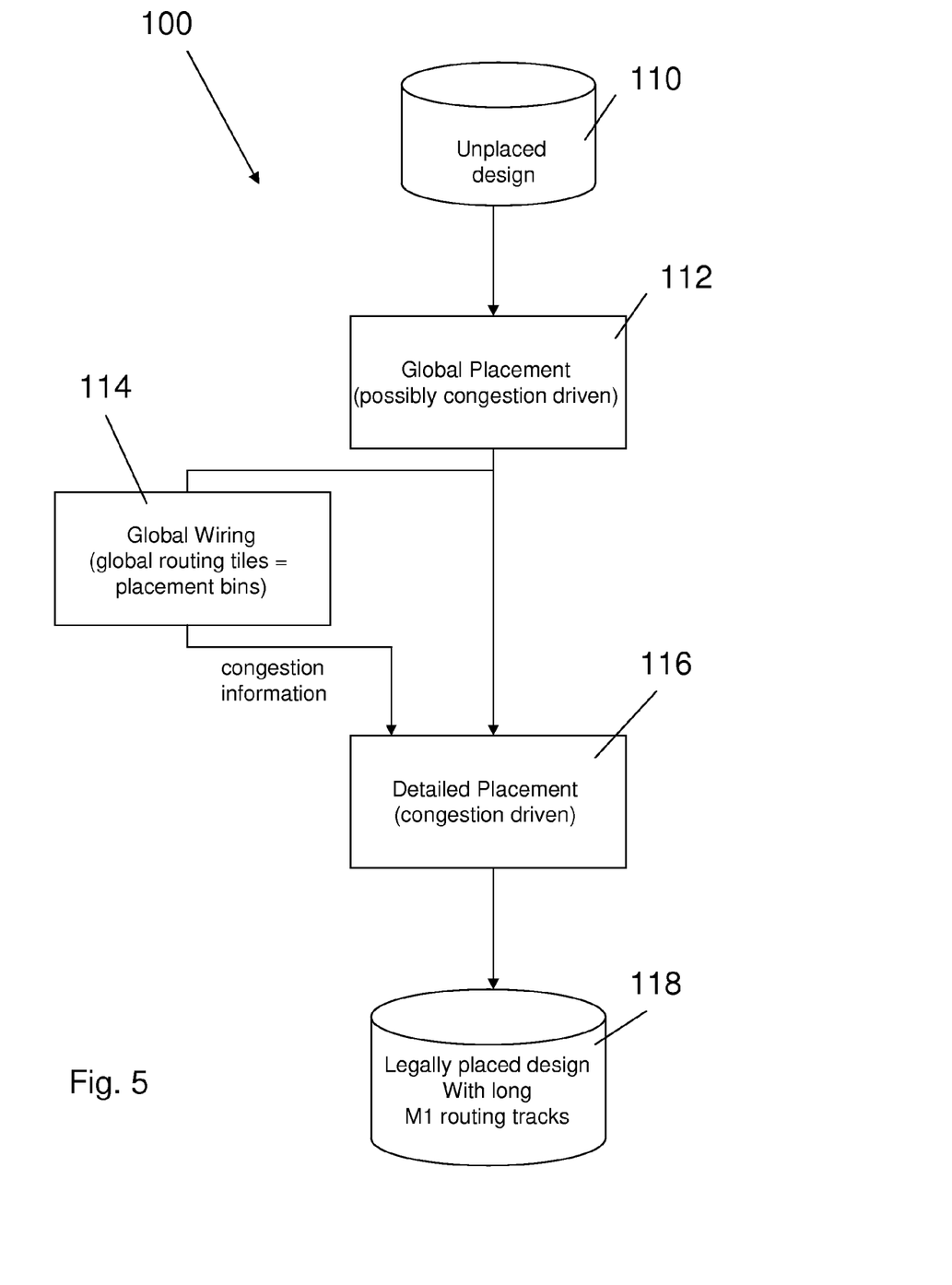
FIG. 5 method flow diagram of a preferred embodiment of the invention.

Referring now to FIG. 5, a method flow diagram 100 of the preferred embodiment of the invention described above is shown. The method sets out from an unplaced design 110 of cells on a chip. In a first step, a global placement process 112 partitions the chip into a hierarchy of placement levels of bins and positions the cells exactly positioned into those bins subject to certain pre-determined criteria such as minimizing the critical net delays and/or making the chip as dense as possible. If hot spots of wiring on the chip are to be identified and eliminated, this global placement process 112 is preferably carried out as a congestion driven global placement, combining global placement and global routing steps to position the cells on the chip in such a way as to avoid overloaded areas. Subsequently, in a detailed placement process 116 the cells are repositioned in the bins to yield a design 118 with legal arrangement as well as lumping free space for M1 routing channels. The lumping of free space preferably makes use of congestion information obtained from a global wiring process 114 based on the cell position generated in the global placement process 112.

Figure 6:
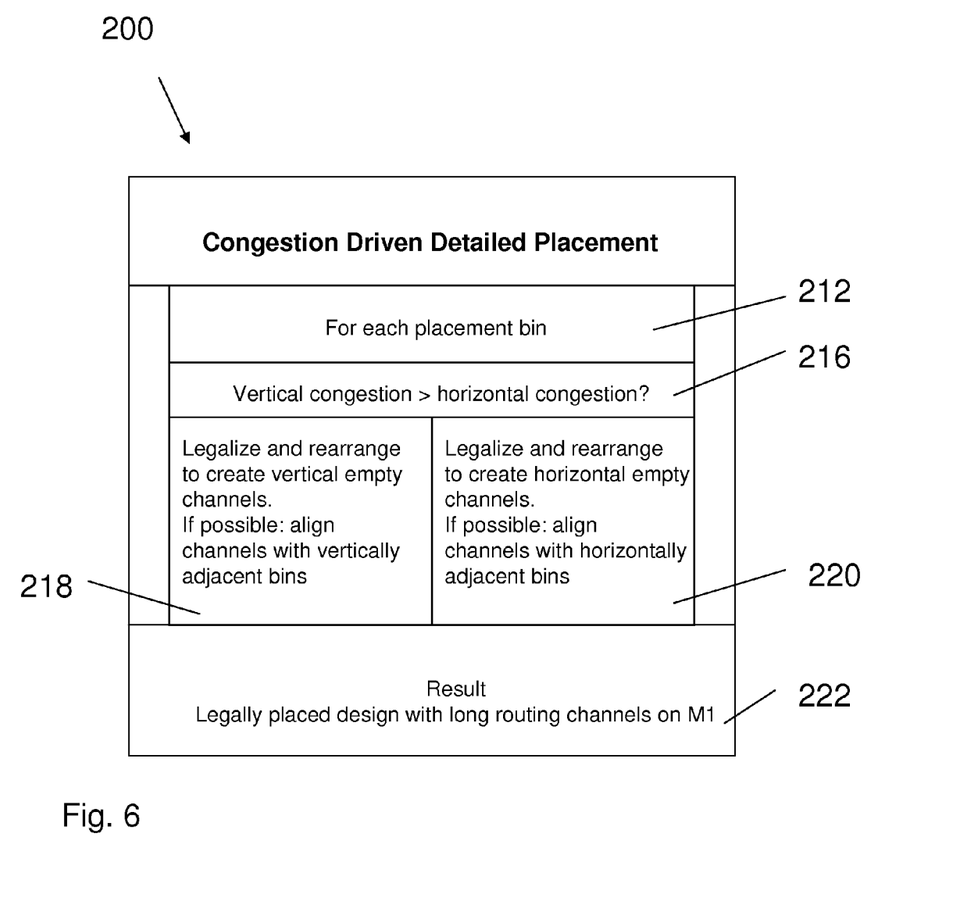
FIG. 6 a method flow diagram of a preferred embodiment of the detailed placement process.

A detailed method flow diagram 200 of a preferred embodiment of the detailed placement process 116 is shown in FIG. 6. For each placement bin, the detailed placement process uses global congestion information obtained during global placement to decide on whether vertical congestion exceeds horizontal congestion (step 216). If this is the case, the cells are legalized and rearranged to create vertical empty channels (step 218). Wherever possible, channels in vertically adjacent bins are aligned to create long vertical routing channels extending over several bins. If, on the other hand, horizontal congestion exceeds vertical congestion, the cells are legalized and rearranged to create horizontal empty channels (step 220). Wherever possible, channels in horizontally adjacent bins are aligned to create long horizontal routing channels extending over several bins, as shown in FIG. 3. This process is carried out for each bin on the chip. The result of this detailed placement is a legal design with long routing channels on M1 (step 222), with the routing channels extending in the vertical or the horizontal direction subject to a global congestion criterion. Different routing directions can be present in different regions of the chip.

Figure 7:
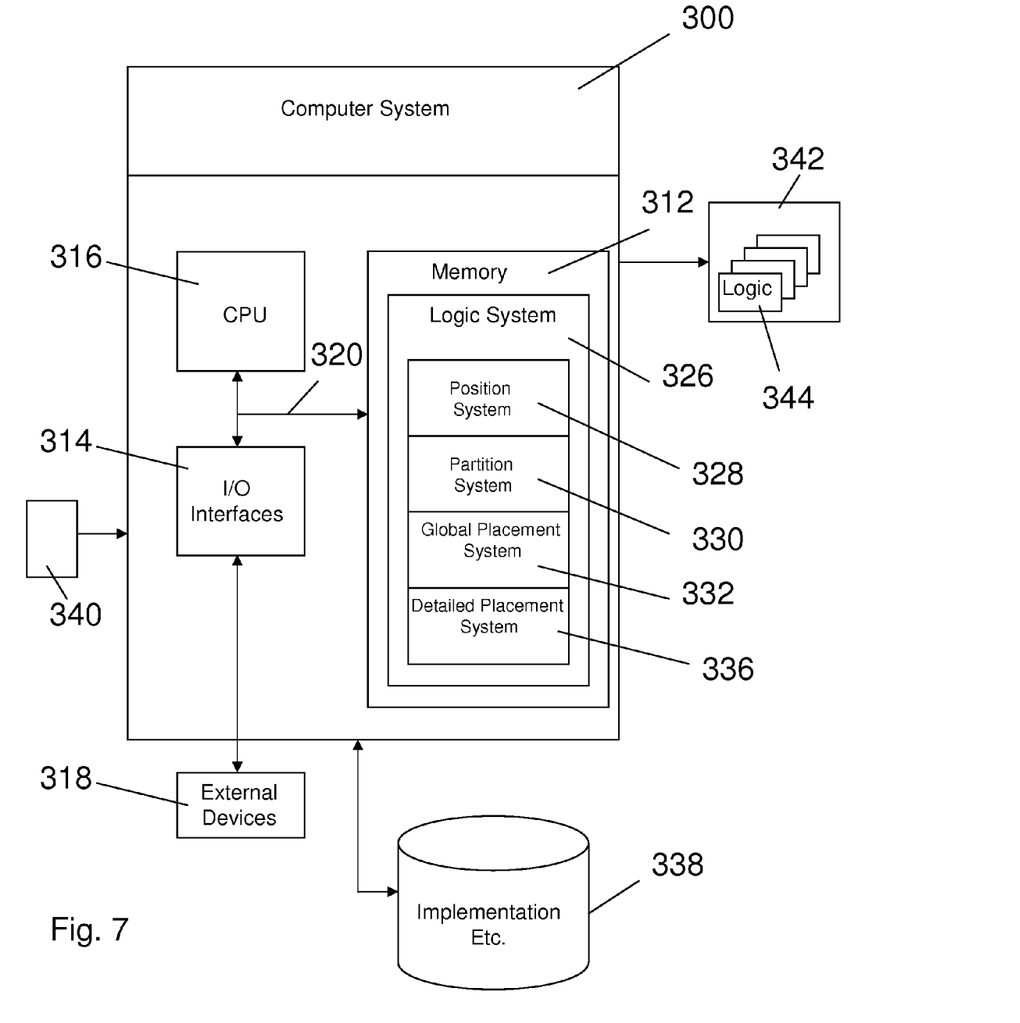
FIG. 7 a computer system implementation of the present invention.

Referring now to FIG. 7, a computer system 300 implementation of the present invention is shown. Specifically, the present invention can be implemented as a computer system 300 and/or program product 326 for virtually placing cells 11 on a chip in such a way as to accumulate free space in the M1 level to be used for routing. This allows user 340 to run simulations before manually performing logic placement. As depicted, computer system 300 generally comprises memory 312, input/output (I/O) interfaces 314, a central processing unit (CPU) 316, external devices/resources, bus 320 and database 338. Memory 312 may comprise any known type of data storage and/or transmission media, including magnetic media, optical media, random access memory (RAM), read-only memory (ROM), a data cache, a data object, etc. Moreover, memory 312 may reside at a single physical location, comprising one or more types of data storage, or be distributed across a plurality of physical systems in various forms. CPU 316 may likewise comprise a single processing unit, or be distributed across one or more processing units in one or more locations, e.g., on a client and server.

I/O interfaces 314 may comprise any system for exchanging information from an external source. External devices 318 may comprise any known type of external device, including speakers, a CRT, LED screen, hand-held device, keyboard, mouse, voice recognition system, speech output system, printer, monitor, facsimile, pager, etc. Bus 320 provides a communication link between each of the components in the computer system 300 and likewise may comprise any known type of transmission link, including electrical, optical, wireless, etc. In addition, although not shown, additional components, such as cache memory, communication systems, system software, etc., may be incorporated into computer system 300.

Database 338 provides storage for information necessary to carry out the present invention. Such information could include, inter alia: (1) probabilities; (2) potential implementations; (3) wiring availability; etc. Database 338 may include one or more storage devices, such as a magnetic disk drive or an optical disk drive. In another embodiment database 338 includes data distributed across, for example, a local area network (LAN), wide area network (WAN) or a storage area network (SAN) (not shown). Database 338 may also be configured in such a way that one of ordinary skill in the art may interpret it to include one or more storage devices. Moreover, it should be understood that database 338 could alternatively exist within computer system 300.

Stored in memory 312 is logic system 326. As depicted, logic system 126 generally includes position system 328, partition system 330, a global placement system 332 and a detailed placement system 336. The systems shown herein carry out the functions described above.

Position system 328 will initially position cells 11 on chip 10. Once positioned, chip 10 will be partitioned into a first placement level of four bins 12 or quadrants by partition system 330, and the cells 11 will be arranged in the four bins by position system 328 (e.g., based on quadratic optimization or min-cut). Starting from a predetermined placement level, the global placement system 332 will determine the potential implementations for wiring interconnects between the cells 11 on chip 10 and reposition cells to improve wireability. Subsequently, the detailed placement system 336 will legally arrange the cells 11 in the bins 10 such as to accumulate free space for routing.

The invention can be applied to all chip design processes using standard cells, e.g. to the design of ASICs, processors etc.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The invention claimed is:

1. A method for placing cells comprising electric circuits in integrated circuit chip design, comprising using a computer to perform the steps of performing a global placement to partition the chip into bins with each electric circuit being assigned to exactly one bin; and performing a global wiring of said chip based on the given bin structure and calculating the horizontal and vertical wiring congestion for each bin;

performing a detailed placement step arranging said cells in such a way that long vertical or horizontal free spaces including routing channels are generated with the orientation of the routing channels in a local area under consideration being chosen depending on a local congestion criterion derived from said global placement.

2. The method of claim 1, characterized in that during said global placement process the cells are in the bins based on a congestion criterion.

3. The method of claim 1, characterized in that during said detailed placement step said cells and free space are clustered in said bins depending on a global congestion criterion in at least one wiring layer.

4. The method of claim 1, characterized in that said cells are placed such that routing channels in a first direction are generated during detailed placement if a local congestion is higher in said first direction compared to a second direction being orthogonal to said first direction.

5. The method of claim 1, characterized in that said free space for routing is aligned between adjacent bins so as to form routing channels spanning several bins.

6. The method of claim 1, characterized in that said free space for routing is used to route long interconnects.

7. A system for placing electric circuits in integrated circuit chip design, comprising a data processing system having:
   a partition system for partitioning a chip into a placement level of bins;
   a position system for positioning cells comprising said circuits in the bins; and
   a placement system for placing the cells in the bins according to the steps of:
   performing a global placement to partition the chip into bins with each electric circuit being assigned to exactly one bin; and
   performing a global wiring of said chip based on the given bin structure and calculating the horizontal and vertical wiring congestion for each bin;
   performing a detailed placement step arranging said cells in such a way that long vertical or horizontal free spaces are generated with the orientation of routing channels in a local area under consideration being chosen depending on a local congestion criterion derived from said global placement.

8. The system of claim 7, wherein the placement system comprises
   a global placement system for placing the cells in the bins; and
   a detailed placement system for legally arranging the cells in the bins such as to accumulate free space for routing.

9. A data processing system comprising a computer having non-transitory stored software code for performing a method according to the steps of using said computer for:
   performing a global placement to partition the chip into bins with each electric circuit being assigned to exactly one bin; and
   performing a global wiring of said chip based on the given bin structure and calculating the horizontal and vertical wiring congestion for each bin; and
   performing a detailed placement step arranging said cells in such a way that long vertical or horizontal free spaces are generated with the orientation of routing channels in a local area under consideration being chosen depending on a local congestion criterion derived from said global placement when said program is run on a computer in said data processing system.

10. A program product stored on a non-transitory computer usable medium comprising computer readable program means for causing a computer to perform a method according to the steps of using a computer for:
    performing a global placement to partition the chip into bins with each electric circuit being assigned to exactly one bin; and
    performing a global wiring of said chip based on the given bin structure and calculating the horizontal and vertical wiring congestion for each bin;
    performing a detailed placement step arranging said cells in such a way that long vertical or horizontal free spaces are generated with the orientation of routing channels in a local area under consideration being chosen depending on a local congestion criterion derived from said global placement when said program is run on said computer.

11. A program product stored on a non-transitory computer usable medium comprising computer readable program means for placing cells comprising electric circuits on a chip, wherein the computer readable program when executed on a computer causes the computer to
    perform a global placement to partition the chip into bins with each logic circuit being assigned to exactly one bin; and
    perform a global wiring of said chip based on the given bin structure and calculate the horizontal and vertical wiring congestion for each bin;
    perform a detailed placement step arranging said cells in such a way that long vertical or horizontal free spaces are generated with the orientation of routing channels in a local area under consideration being chosen depending on a local congestion criterion derived from said global placement.

* * * * *